US 6,534,243 B1

(12) United States Patent
Templeton et al.

(10) Patent No.: US 6,534,243 B1
(45) Date of Patent: Mar. 18, 2003

(54) CHEMICAL FEATURE DOUBLING PROCESS

(75) Inventors: Michael K. Templeton, Atherton, CA (US); Ramkumar Subramanian, San Jose, CA (US); Bharath Rangarajan, Santa Clara, CA (US); Kathleen R. Early, Sausalito, CA (US); Ursula Q. Quinto, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/000,493

(22) Filed: Oct. 23, 2001

Related U.S. Application Data
(60) Provisional application No. 60/242,477, filed on Oct. 23, 2000.

(51) Int. Cl.[7] ............................. G03F 7/039; G03F 7/20; G03F 7/40
(52) U.S. Cl. ..................... 430/312; 430/324; 430/328
(58) Field of Search ........................ 430/312, 328, 430/324

(56) References Cited

U.S. PATENT DOCUMENTS

| | | | |
|---|---|---|---|
| 5,342,727 A | 8/1994 | Viccari et al. | 430/157 |
| 5,538,833 A | 7/1996 | Ferguson et al. | 430/325 |
| 5,807,649 A | 9/1998 | Liebmann et al. | 430/5 |
| 5,814,432 A * | 9/1998 | Kobayashi | 430/312 |
| 5,858,620 A | 1/1999 | Ishibashi et al. | 430/313 |
| 6,107,002 A * | 8/2000 | Holscher et al. | 430/328 |

OTHER PUBLICATIONS

Toyoshima, Toshiyuki, et al. 0.1 μm Level Contact Hole Pattern Formation with KrF Lithography by Resolution Enhnacement Lithography Assisted by Chemical Shrink (RELACS), Advanced Technology R&D Center, Mitsubishi Electric Corp., IEDM 98–333–336.

"Monitoring acid diffusion in chemically amplified photoresists," Department of Chemistry and Biochemistry, University of Texas at Austin, Feb. 8, 1998, http://willson.cm.utexas.edu/research/hv/aciddiffusion.htm.

* cited by examiner

*Primary Examiner*—Richard L. Schilling
(74) *Attorney, Agent, or Firm*—Amin & Turocy, LLP

(57) ABSTRACT

In one embodiment, the present invention relates to a method of treating a patterned resist involving providing the patterned resist having a first number of structural features, the patterned resist comprising an acid catalyzed polymer; contacting a coating containing a coating material, at least one basic compound, a photoacid generator, and a dye with the patterned resist; irradiating the coated patterned resist; permitting a deprotection region to form within an inner portion of the patterned resist; and removing the coating and the deprotection region to provide a second number of patterned resist structural features, wherein the first number is smaller than the second number.

20 Claims, 3 Drawing Sheets

CHEMICAL FEATURE DOUBLING PROCESS

RELATED APPLICATIONS

This application claims priority to provisional application 60/242,477 filed Oct. 23, 2000.

TECHNICAL FIELD

The present invention generally relates to improving lithography by using a coating containing a cleaving compound to trim resist features. In particular, the present invention relates to using a stabilization coating and irradiation to double the number of developed resist structures.

BACKGROUND ART

In the semiconductor industry, there is a continuing trend toward higher device densities. To achieve these high densities there has been and continues to be efforts toward scaling down the device dimensions on semiconductor wafers. In order to accomplish such high device packing density, smaller and smaller features sizes are required. This includes the width and spacing of interconnecting lines and the surface geometry such as corners and edges of various features. Since numerous interconnecting lines are typically present on a semiconductor wafer, the trend toward higher device densities is a notable concern.

The requirement of small features (and close spacing between adjacent features) requires high resolution photolithographic processes. In general, lithography refers to processes for pattern transfer between various media. It is a technique used for integrated circuit fabrication in which a silicon slice, the wafer, is coated uniformly with a radiation-sensitive film, the resist, and an exposing source (such as optical light, X-rays, or an electron beam) illuminates selected areas of the surface through an intervening master template, the photomask, for a particular pattern. The lithographic coating is generally a radiation-sensitized coating suitable for receiving a projected image of the subject pattern. Once the image is projected, it is indelibly formed in the coating. The projected image may be either a negative or a positive of the subject pattern. Exposure of the coating through the photomask causes a chemical transformation in the exposed areas of the coating thereby making the image area either more or less soluble (depending on the coating) in a particular solvent developer. The more soluble areas are removed in the developing process to leave the pattern image in the coating as less soluble polymer.

Projection lithography is a powerful and essential tool for microelectronics processing. However, lithography is not without limitations. Patterning features having dimensions of about 0.25 $\mu$m or less with acceptable resolution is difficult at best, and impossible in some circumstances. Patterning small features with a high degree of critical dimension control is also very difficult. Procedures that increase resolution, improved critical dimension control, and provide small features are therefore desired.

SUMMARY OF THE INVENTION

The present invention provides a chemical feature doubling processes, methods of forming sub-lithographic features, and methods of treating patterned resists. The present invention also provides size reduced resist features that are particularly useful for subsequent semiconductor processing procedures. The methods of forming sub-lithographic features and treating patterned resists are conducted in a controllable manner whereby the number of resist features is doubled and thus the spacing of resist features on a substrate may be decreased.

In one embodiment, the present invention relates to a method of treating a patterned resist involving providing the patterned resist having a first number of structural features, the patterned resist comprising an acid catalyzed polymer; contacting a coating containing a coating material, at least one basic compound, a photoacid generator, and a dye with the patterned resist; irradiating the coated patterned resist; permitting a deprotection region to form within an inner portion of the patterned resist; and removing the coating and the deprotection region to provide a second number of patterned resist structural features, wherein the first number is smaller than the second number.

In another embodiment, the present invention relates to a method of decreasing the spacing between patterned resist features involving depositing a coating over the patterned resist features having a first spacing therebetween, the coating comprising at least a basic compound, a photoacid generator, a light absorbing dye, and a coating material, the patterned resist feature comprising a polymer having an acid labile pendent group; irradiating the coated patterned resist features, thereby forming a deprotected region in the inner portions of the patterned resist features; and removing the coating and the deprotected region thereby providing patterned resist features having a second spacing therebetween, wherein the second spacing is smaller than the first spacing.

In yet another embodiment, the present invention relates to a method of making a sub-lithographic structure, involving patterning a chemically amplified resist so as to have lithographic structures; contacting coating with the patterned chemically amplified resist, the coating comprising an amine or a hydroxide compound, a photoacid generator, a light absorbing dye, and a coating material; irradiating the coated patterned chemically amplified resist; removing the coating from the patterned chemically amplified resist; and contacting the patterned chemically amplified resist with an aqueous alkaline developer to provide the sub-lithographic structure.

DISCLOSURE OF INVENTION

Figure 1:
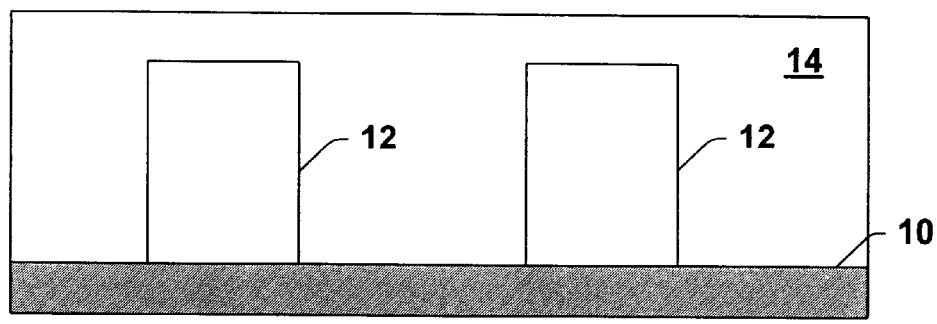
FIG. 1 illustrates a cross-sectional view of one aspect of a method according to the present invention.

The present invention involves using a coating and irradiation to controllably decrease the size of developed resist structures, double the number of developed resist structures on a substrate, and decrease the spacing between some of the developed resist structures. The present invention thus involves methods of decreasing the size of patterned resist features below the limitations associated with lithography.

Basically, a coating containing a basic compound, a photoacid generator, and optionally a dye is deposited over a patterned resist. While the resist is in contact with the coating, the basic compound diffuses into portions of the resist adjacent the coating. The structure is subject to a flood exposure of radiation whereby light penetrates deeply into the patterned resist but shallowly into the coating. The irradiation induces the photoacid generator in shallow portions of the coating and the photoacid generator in the patterned resist to produce acid. The acid generated causes a chemical change in the inner portions of the patterned resist wherein labile groups of the resist polymer are cleaved or deprotected. Since the radiation does not penetrate deeply into the coating, and since the coating contains a basic compound that diffuses into the patterned resist, the outer portions of the patterned resist are not subject to the chemical change induced by the photoacid generator. After or during removal of the coating from the structure, the cleaved or deprotected portions of the resist are removable by an appropriate solvent or developer. That is, the acid generated cleaves labile moieties of the resist material, thereby changing the solubility characteristics of the inner portions of the resist material wherein such cleavage takes place. Sublithographic features are obtainable according to the present invention.

For example, a coating containing a basic compound, a photoacid generator, and a light absorbing dye is deposited over a patterned acid catalyzed resist clad structure. While the resist is in contact with the coating, the basic compound diffuses into the portions of the resist adjacent the coating forming a thin base rich layer within the resist. The entire structure is subject to irradiation, such as an ultraviolet (UV) flood exposure. The light absorbing dye prevents the UV light from deeply penetrating the coating. The flood exposure induces the photoacid generator that is located in the top portion of the coating (at shallow depths) to generate an acid that is substantially neutralized by the basic compound. The flood exposure also induces the photoacid generator that is located in the resist structure to generate an acid and the acid interacts with the patterned acid catalyzed resist whereby a chemical interaction takes place within the inner portions of the resist forming a deprotected region within the resist. Since the basic compound in the thin base rich layer within the resist neutralizes any acid in the thin base rich layer, the chemical interaction takes place within the inner portions of the resist. The chemical interaction (acid catalyzed deprotection) begins at the top of the resist structure and migrates through the middle or inner portions of the structure (portions where the basic compound did not diffuse). That is, hydronium ions or protons cleave acid labile moieties of the resist material, such as t-butoxycarbonyl moieties from a resist polymer backbone, thereby changing the solubility characteristics of that portion of the resist material. Since the light absorbing dye prevents UV light from inducing the formation of acid adjacent the patterned resist at deeper depths within the coating, and since the basic compound diffuses into the patterned resist and thus is available to neutralize acid, the outer regions of the patterned resist are not subject to the chemical deprotection interaction.

Although the basic compound diffuses into the top of the patterned resist, the acid generated in the top portion of the coating may exceed the amount of basic compound locally present that is available to neutralize it, the acid proceeds to deprotect the inner regions of the patterned resist features.

After the deprotection reaction is permitted to run it course, the coating is removed from the structure using a suitable solution, such as an aqueous solution or a developer. The deprotected regions within the acid catalyzed resist are also removed by a suitable solvent such as developer. The coating and the deprotected regions within the acid catalyzed resist may be removed at the same time or in separate steps, depending upon the solubility of the coating/deprotected regions in certain solutions. The number of resulting features of the acid catalyzed resist is about double than the number of the originally patterned acid catalyzed resist features. The spacing between the resulting features of the acid catalyzed resist may be smaller than the spacing between the originally patterned acid catalyzed resist features.

Initially, a resist is deposited over a substrate. The substrate is typically a silicon substrate optionally with various elements and/or layers thereover; including metal layers, barrier layers, dielectric layers, device structures, active elements and passive elements including polysilicon gates, wordlines, source regions, drain regions, bit lines, bases, emitters, collectors, conductive lines, conductive plugs, etc.

The resist is provided over a portion of the substrate or over all of the substrate. The resist is then patterned using suitable lithography techniques. For example, a mask is employed to selectively irradiate the resist, followed by development wherein the exposed or unexposed portions of the resist are removed. Any developer may be used to remove the exposed or unexposed portions of the resist including aqueous alkaline developers. Aqueous alkaline developers typically contain a hydroxide compound, such as tetramethylammonium hydroxide.

Any suitable resist polymer having a labile group may be employed in the present invention. The polymers are generally obtained by one or more of vinylic addition polymerization, condensation, polyaddition, and addition condensation. Suitable resist polymer have a cleavable labile group, such as an acid labile group (cleavable by an acid), a base labile group (cleavable by a base), and an organic labile group (cleavable by an organic compound). Typically, the resist polymer has a pendant labile group attached to the polymer backbone. Alternatively, the resist polymer has a labile group attached to one or more terminuses of the polymer backbone.

Generally, in one embodiment, the polymer is a polymer or copolymer of vinyl phenol and optionally other copolymerizable group(s). Copolymers comprise units of substituted or unsubstituted phenols and non-aromatic groups, particularly copolymers of vinyl phenols and alkyl acrylates, typically alkyl acrylates having from 1 to about 12 carbon atoms. Preferred are copolymers of vinyl phenols and acrylates having branched alkyl chains, such as copolymers formed from t-butyl acrylate, t-butyl methacrylate, etc.

In one embodiment, the polymer is at least one of poly(p-tert-butoxycarbonyloxy-$\alpha$-methylstyrene), poly(p-tert-butoxycarbonyloxystyrene), poly(tert-butyl p-vinylbenzoate), poly(tert-butyl p-isopropenylphenyloxyacetate), poly(tert-butyl methacrylate), polymethylmethacrylate, acrylate based polymers, a novolak/diazonaphthoquinione resin, a nitrene crossed hydroxystyrene polymer, and poly(butene-1-sulfone). In another embodiment, the polymer comprises phenolic and cyclic alcohol units. In this embodiment, the polymer is formed by the hydrogenation of a phenol formaldehyde (novolak) or a poly(vinylphenol) resin. In yet another embodiment, the polymer comprises hydroxystyrene and acrylate, methacrylate, mixtures of acrylate and methacrylate, adamantyl methacrylate, 3-oxo-cyclohexyl methacrylate, tetrahydropyrannymethacrylate, trycyclodecanyl acrylate, isobornyl polymers, polynorbornene, polyanthrylmethacrylate, poly(vinylmethyl ether-co-maliec anhydride), poly(styrene-co-maliec anhydride).

In another embodiment, the polymeric material includes a partially t-butoxycarbonyloxy substituted poly-p-hydroxystyrene, partially t-butoxycarbonyloxy substituted poly-3-hydroxyphenyl phenylsiloxane, partially t-butyl substituted polymethacrylate, and partially adamantyl substituted polymethacrylate.

In one embodiment, the resist contains an acid catalyzed resin material. The acid catalyzed resin material undergoes a chemical change upon exposure to actinic radiation. Acid catalyzed or chemically amplified resist compositions generally comprise a photosensitive acid (photoacid) generator and a polymer. The polymer has acid sensitive side chain (pendent) groups which are bonded to the polymer backbone and are reactive towards a proton. Upon imagewise exposure to radiation or heat, the photoacid generator produces a proton. The proton causes catalytic cleavage of an acid labile pendant group from the polymer backbone. The proton is not consumed in the cleavage reaction and catalyzes additional cleavage reactions thereby chemically amplifying the photochemical response of the resist. The cleaved polymer is soluble in polar developers while the unexposed polymer is soluble in nonpolar organic solvents. Thus the resist can provide positive or negative images of the mask depending of the selection of the developer solvent.

Generally, in many embodiments, the acid labile pendent groups attached to the resist polymer are tert-butyl esters of carboxylic acids and tert-butyl carbonates of phenols, including trityl, benzyl, benzyhdryl modifications thereof. In one embodiment, the acid labile groups include acetate groups such as acetate groups of Formula (I) $CR^1R^2C(=O)OR^3$, where $R^1$ and $R^2$ are each independently one of hydrogen, an electron withdrawing group such as halogen, lower alkyl having from 1 to about 10 carbon atoms, and substituted lower alkyl having from 1 to about 10 carbon atoms; and $R^3$ is substituted and unsubstituted lower alkyl having from 1 to about 10 carbon atoms, substituted and unsubstituted aryl having from 1 to about 10 carbon atoms, substituted or unsubstituted benzyl having from about 7 to about 13 carbon atoms. The substituents can be, for example, one or more halogen, lower alkyl, lower alkoxy, aryl or benzyl. $R^1$ and $R^2$ in one embodiment are each hydrogen. In a preferred embodiment, $R^1$ and $R^2$ are both fluorine. In another embodiment, the acid labile groups include oxycarbonyl groups of the formula $C(=O)OR^3$, where $R^3$ is the same as defined above. In a preferred embodiment, $R^3$ is tert-butyl or benzyl.

In another embodiment, examples of the acid labile group include tertiary alkoxy groups such as tert-butoxy; tert-butyl methacrylate, carbonate groups such as tert-butoxycarbonyloxy; tertiary carboxylate groups such as tert-butoxycarbonylmethyloxy; trialkylsilyloxy groups such as trimethylsilyloxy, triethylsilyloxy, and tert-butyl-dimethylsilyloxy; and acetal and ketal groups such as tetrahydrofuranyloxy, tetrahydropyranyloxy, 2-methoxytetra-hydropyranyloxy, methoxymethyloxy, 1-ethoxyethoxy, 1-propoxyethoxy, 1-n-butoxyethoxy, 1-isobutoxyethoxy, 1-sec-butoxyethoxy, 1-tert-butoxyethoxy, 1-amyloxyethoxy, 1-ethoxy-1-methylethoxy, 1-propoxy-1-methylethoxy, 1-n-butoxy-1-methylethoxy, 1-isobutoxy-1-methylethoxy, 1-sec-butoxy-1-methylethoxy, 1-tert-butoxy-1-methylethoxy, and 1-amyloxy-1-methylethoxy groups.

Preferred examples of the aromatic group having an acid labile group are tert-butoxyphenyl, tert-butoxycarbonylmethyloxyphenyl, (1-ethoxyethoxy)phenyl, tetrahydropyranyloxyphenyl, and tetrahydrofuranyloxyphenyl groups.

The photoacid generator may be chosen from a wide variety of compounds known to form acid upon exposure to activating radiation. These photoacid generators form an acid in response to radiation of different wavelengths ranging from visible to X-ray. In one general embodiment, photoacid generating compounds include aromatic substituted halohydrocarbons (such as 1,1-bis(p-chlorophenyl)-2,2,2-trichloroethane), halo-substituted sulfur containing compounds, haloheterocyclic compounds, onium salts (such as diaryl diazonium salts), sulfonated esters, and sulfonated ketones.

In one embodiment, the photoacid generator is one or more unsubstituted and symmetrically or unsymmetrically substituted diaryliodonium, aryldiazonium, triarylselenonium or triarylsulfonium salts. In another embodiment, the photoinitiator is one or more nitrobenzyl esters and s-triazine derivatives.

In one embodiment, the photoacid generator is an o-quinone diazide sulfonic acid ester including 2,1,4-diazonaphthoquinone sulfonic acid esters and the 2,1,5-diazonaphthoquinone sulfonic acid esters. In another embodiment, the photoacid generator is a sulfonated ester including sulfonyloxy ketones. Examples include benzoin tosylate, t-butylphenyl alpha-(p-toluenesulfonyloxy)-acetate, and t-butyl alpha-(p-toluenesulfonyloxy)-acetate.

In yet another embodiment, the photoacid generator is an onium salt. Examples of suitable onium salts are diaryldiazonium salts and onium salts of Group Va and B, Ia and B and I of the Periodic Table, for example, halonium salts, quaternary ammonium, phosphonium and arsonium salts, aromatic sulfonium salts and sulfoxonium salts or seleonium salts.

In still yet another embodiment, the photoacid generator includes triaryl sulfonium hexafluoroantimonate, diaryliodonium metal halides, and certain non-ionic acid generators such as tris(sulfonate) of pyrogallol, and N-sulfonyloxynaphthalimides. In this embodiment, preferred examples include triphenylsulfonium trillate and N-sulfonyloxynaphthalimide generators such as N-camphorsulfonyloxynaphthalimide and N-pentafluorobenzenesulfonyloxnaphthalimide.

In yet another embodiment, the photoacid generator includes halogenated non-ionic, photoacid generating compounds such as, for example, 1,1-bis [p-chlorophenyl]-2,2,2-trichloroethane (DDT); 1,1-bis [p-methoxyphenyl]-2,2,2-trichloroethane; 1,2,5,6,9,10-hexabromocyclododecane; 1,10-dibromodecane; 1,1-bis[p-chlorophenyl]-2,2-dichloroethane; 4,4'-dichloro-2-(trichloromethyl) benzhydrol (Kelthane); hexachlorodimethyl sulfone; 2-chloro-6-(trichloromethyl) pyridine; 0,0-diethyl-0-(3,5,6-trichloro-2-pyridyl)phosphorothionate; 1,2,3,4,5,6-hexachlorocyclohexane; N(1,1-bis [p-chlorophenyl]-2,2,2-trichloroethyl)acetamide; tris [2,3-dibromopropyl] isocyanurate; 2,2-bis [p-chlorophenyl]-1,1-dichloroethylene; tris [trichloromethyl] s-triazine; and their isomers, analogs, homologs, and residual compounds.

In yet another embodiment, the photoacid generator includes sulfonium salts. Examples of sulfonium salts include tris(4-dimethylaminophenyl)sulfonium p-toluenesulfonate; bis(4-tert-butoxyphenyl)(4-dimethylaminophenyl)sulfonium p-toluenesulfonate;

(4-tert-butoxyphenyl)bis(4-dimethylaminophenyl) sulfonium p-toluenesulfonate; bis(4-tert-butoxycarbonylmethyloxyphenyl)(4-dimethylaminophenyl)sulfonium p-toluenesulfonate; (4-tert-butoxycarbonylmethyloxyphenyl)bis(4-dimethylaminophenyl)sulfonium p-toluenesulfonate; bis(4-(1-ethoxyethyloxy)phenyl)(4-dimethylaminophenyl)-sulfonium p-toluenesulfonate; (4-(1-ethoxyethyloxy)phenyl)bis(4-dimethylaminophenyl)-sulfonium p-toluenesulfonate; bis(4-tetrahydropyranyloxyphenyl)(4-dimethylaminophenyl)-sulfonium p-toluenesulfonate; (4-tetrahydrofuranyloxyphenyl)bis(4-dimethylaminophenyl)-sulfonium p-toluenesulfonate; tris(4-dimethylaminophenyl)sulfonium p-ethylbenzenesulfonate; bis(4-tert-butoxyphenyl)(4-dimethylaminophenyl)sulfonium p-ethylbenzenesulfonate; (4-tert-butoxyphenyl)bis(4-dimethylaminophenyl) sulfonium p-ethylbenzenesulfonate; tris(4-dimethylaminophenyl)sulfonium 2,4-dimethylbenzenesulfonate; bis(4-tert-butoxyphenyl)(4-dimethylaminophenyl)sulfonium 2,4-dimethylbenzenesulfonate; (4-tert-butoxyphenyl)bis(4-dimethylaminophenyl)sulfonium 2,4-dimethylbenzenesulfonate; (4-tert-butoxyphenyl)bis(4-dimethylaminophenyl)sulfonium p-tert-butylbenzenesulfonate; bis(4-tert-butoxycarbonylmethyloxyphenyl)(4-dimethylaminophenyl)sulfonium 2,5-dimethylbenzenesulfonate; (4-tert-butoxycarbonylmethyloxyphenyl)bis(4-dimethylaminophenyl)sulfonium n-octylbenzenesulfonate; tris(4-dimethylaminophenyl)sulfonium p-tert-butylbenzenesulfonate; bis(4-tert-butoxyphenyl)(4-dimethylaminophenyl)sulfonium p-tert-butylbenzenesulfonate; (4-tert-butoxyphenyl)bis(4-dimethylaminophenyl)sulfonium benzenesulfonate; bis(4-tert-butoxycarbonylmethyloxyphenyl)(4-dimethylaminophenyl)sulfonium benzenesulfonate; (4-tert-butoxycarbonylmethyloxyphenyl)bis(4-dimethylaminophenyl)sulfonium benzenesulfonate; tris(3-dimethylaminophenyl)sulfonium p-toluenesulfonate; bis(4-tert-butoxyphenyl)(3-dimethylaminophenyl)sulfonium p-toluenesulfonate; (4-tert-butoxyphenyl)bis(3-dimethylaminophenyl)sulfonium p-toluenesulfonate; bis(4-tert-butoxycarbonylmethyloxyphenyl)(3-dimethylaminophenyl)sulfonium p-toluenesulfonate; (4-tert-butoxycarbonylmethyloxyphenyl)bis(3-dimethylaminophenyl)sulfonium p-toluenesulfonate; bis(4-(1-ethoxyethyloxy)phenyl)(3-dimethylaminophenyl)-sulfonium p-toluenesulfonate; (4-(1-ethoxyethyloxy)phenyl)bis(3-dimethylaminophenyl)-sulfonium p-toluenesulfonate; bis(4-tetrahydropyranyloxyphenyl)(3-dimethylaminophenyl)-sulfonium p-toluenesulfonate; (4-tetrahydrofuranyloxyphenyl)bis(3-dimethylamino p-henyl)sulfonium p-toluenesulfonate; tris(3-dimethylaminophenyl)sulfonium p-ethylbenzenesulfonate; bis(4-tert-butoxyphenyl)(3-dimethylaminophenyl) sulfonium 2,4-dimethylbenzenesulfonate; (4-tert-butoxycarbonylmethyloxyphenyl)bis(3-dimethylaminophenyl)sulfonium n-octylbenzenesulfonate; bis(4-tert-butoxyphenyl)(3-dimethylaminophenyl)sulfonium benzenesulfonate; (4-tert-butoxyphenyl)bis(3-dimethylaminophenyl)sulfonium p-tert-butylbenzenesulfonate; bis(4-tert-butoxycarbonylmethyloxyphenyl)(3-dimethylaminophenyl)sulfonium benzenesulfonate, (4-tert-butoxycarbonylmethyloxyphenyl)bis(3-dimethylaminophenyl)sulfonium benzenesulfonate; tris(4-(2-picolyloxy) phenyl)sulfonium p-toluenesulfonate; bis(4-tert-butoxyphenyl)(4-(2-picolyloxy)phenyl)sulfonium p-toluenesulfonate; (4-tert-butoxyphenyl)bis(4-(2-picolyloxy)phenyl)sulfonium p-toluenesulfonate; bis(4-tert-butoxycarbonylmethyloxyphenyl)(4-(2-picolyloxy)phenyl) sulfonium p-toluenesulfonate; (4-tert-butoxycarbonylmethyloxyphenyl)bis(4-(2-picolyloxy)phenyl)sulfonium p-toluenesulfonate; bis(4-(1-ethoxyethyloxy)phenyl)(4-(2-picolyloxy)phenyl)-sulfonium p-toluenesulfonate; (4-(1-ethoxyethyloxy)phenyl)bis(4-(2-picolyloxy)phenyl)-sulfonium p-toluenesulfonate; bis(4-tetrahydropyranyloxyphenyl)(4-(2-picolyloxy)phenyl)-sulfonium p-toluenesulfonate; (4-tetrahydrofuranyloxyphenyl)bis(4-(2-picolyloxy)phenyl)-sulfonium p-toluenesulfonate; tris(4-(2-picolyloxy)phenyl)sulfonium p-ethylbenzene-sulfonate; tris(4-(2-picolyloxy)phenyl)sulfonium 2,4-dimethylbenzenesulfonate; bis(4-tert-butoxyphenyl)(4-(2-picolyloxy)phenyl) sulfonium 2,4-dimethylbenzenesulfonate; (4-tert-butoxyphenyl)bis(4-(2-picolyloxy)phenyl)sulfonium 2,4-dimethylbenzenesulfonate; (4-tert-butoxyphenyl)bis(4-(2-picolyloxy)phenyl)sulfonium p-tert-butylbenzenesulfonate; bis(4-tert-butoxycarbonylmethyloxyphenyl)(4-(2-picolyloxy)phenyl)sulfonium 2,5-dimethylbenzenesulfonate; (4-tert-butoxycarbonylmethyloxyphenyl)bis(4-(2-picolyloxy)phenyl)sulfonium n-octylbenzenesulfonate; tris(4-(2-picolyloxy)phenyl)sulfonium p-tert-butylbenzenesulfonate; bis(4-tert-butoxyphenyl)(4-(2-picolyloxy)phenyl) sulfonium benzenesulfonate; (4-tert-butoxyphenyl)bis(4-(2-picolyloxy)phenyl)sulfonium benzenesulfonate; bis(4-tert-butoxycarbonylmethyloxyphenyl)(4-(2-picolyloxy)phenyl) sulfonium benzenesulfonate; (4-tert-butoxycarbonylmethyloxyphenyl)bis(4-(2-picolyloxy)phenyl)sulfonium benzenesulfonate; tris(4-(4-picolyloxy)phenyl)sulfonium p-toluenesulfonate; bis(4-tert-butoxyphenyl)(4-(4-picolyloxy)phenyl)sulfonium p-toluenesulfonate; (4-tert-butoxyphenyl)bis(4-(4-picolyloxy)phenyl)sulfonium p-toluenesulfonate; bis(4-tert-butoxycarbonylmethyloxyphenyl)(4-(4-picolyloxy)-phenyl) sulfonium p-toluenesulfonate; (4-tert-butoxycarbonylmethyloxyphenyl)bis(4-(4-picolyloxy)-phenyl)sulfonium p-toluenesulfonate; bis(4-(1-ethoxyethyloxy)phenyl)(4-(4-picolyloxy)phenyl)-sulfonium p-toluenesulfonate; (4-(1-ethoxyethyloxy)phenyl)bis(4-(4-picolyloxy)phenyl)-sulfonium p-toluenesulfonate; bis(4-tetrahydropyranyloxyphenyl)(4-( 4-picolyloxy)phenyl)-sulfonium p-toluenesulfonate; (4-tetrahydrofuranyloxyphenyl)bis(4-(4-picolyloxy) phenyl)-sulfonium p-toluenesulfonate; tris(4-(4-picolyloxy) phenyl)sulfonium p-ethylbenzene-sulfonate; tris(4-(4-picolyloxy)phenyl)sulfonium 2,4-dimethylbenzenesulfonate; bis(4-tert-butoxyphenyl)(4-(4-picolyloxy)phenyl) sulfonium 2,4-dimethylbenzenesulfonate; (4-tert-butoxyphenyl)bis(4-(4-picolyloxy)phenyl)sulfonium 2,4-dimethylbenzenesulfonate; (4-tert-butoxycarbonylmethyloxyphenyl)bis(4-(4-picolyloxy)-phenyl)sulfonium 2,4-dimethylbenzenesulfonate; bis(4-tert-butoxyphenyl)(4-(4-picolyloxy)phenyl)sulfonium p-tert-butylbenzenesulfonate; (4-tert-butoxyphenyl)bis(4-(4-picolyloxy)phenyl)sulfonium p-tert-butylbenzenesulfonate; bis(4-tert-butoxycarbonylmethyloxyphenyl)(4-(4-picolyloxy)-phenyl)sulfonium 2,5-dimethylbenzenesulfonate; (4-tert-butoxycarbonylmethyloxyphenyl)bis(4-(4-picolyloxy)-phenyl)sulfonium n-octylbenzenesulfonate; tris(4-(4-picolyloxy)phenyl)sulfonium p-tert-butylbenzenesulfonate; bis(4-tert-butoxyphenyl)(4-(4-picolyloxy)phenyl) sulfonium benzenesulfonate; (4-tert-butoxyphenyl)bis(4-(4-picolyloxy)phenyl)sulfonium p-tert-butylbenzenesulfonate; bis(4-tert-butoxycarbonylmethyloxyphenyl)(4-(4-picolyloxy)-phenyl)sulfonium benzenesulfonate; (4-tert-butoxycarbonylmethyloxyphenyl)bis(4-(4-picolyloxy)-phenyl)sulfonium benzenesulfonate; tris(3-(4-picolyloxy) phenyl)sulfonium p-toluenesulfonate; bis(4-tert-butoxyphenyl)(3-(4-picolyloxy)phenyl)sulfonium p-toluenesulfonate; (4-tert-butoxyphenyl)bis(3-(4-picolyloxy)phenyl)sulfonium p-toluenesulfonate; bis(4-tert-butoxycarbonylmethyloxyphenyl)(3-(4-picolyloxy)-phenyl) sulfonium p-toluenesulfonate; (4-tert-butoxycarbonylmethyloxyphenyl)bis(3-(4-picolyloxy)-phenyl )sulfonium p-toluenesulfonate; bis(4-(1-ethoxyethyloxy)phenyl)(3-(4-picolyloxy)phenyl)-sulfonium p-toluenesulfonate; (4-($^1$-ethoxyethyloxy)phenyl)bis(3-(4-picolyloxy)phenyl)-sulfonium p-toluenesulfonate; bis(4-tetrahydropyranyloxyphenyl)(3-(4-picolyloxy)phenyl)-sulfonium p-toluenesulfonate; (4-tetrahydrofuranyloxyphenyl)bis(3-(4-picolyloxy) phenyl)-sulfonium p-toluenesulfonate; tris(3-(4-picolyloxy) phenyl)sulfonium p-ethylbenzene-sulfonate; tris(3-(4-picolyloxy)phenyl)sulfonium 2,4-dimethyl benzene-sulfonate; bis(4-tert-butoxyphenyl)(3-(4-picolyloxy)phenyl) sulfonium 2,4-dimethylbenzenesulfonate; (4-tert-butoxyphenyl)bis(3-(4-picolyloxy)phenyl)sulfonium 2,4-dimethylbenzenesulfonate; bis(4-tert-butoxycarbonylmethyloxyphenyl)(3-(4-picolyloxy)-phenyl) sulfonium 2,4-dimethylbenzenesulfonate; (4-tert-butoxycarbonylmethyloxyphenyl)bis(3-(4-picolyloxy)-phenyl)sulfonium 2,4-dimethylbenzenesulfonate; (4-tert-butoxycarbonylmethyloxyphenyl)bis(3-(4-picolyloxy)-phenyl)sulfonium n-octylbenzenesulfonate; tris(3-(4-picolyloxy)phenyl)sulfonium benzenesulfonate; bis(4-tert-butoxyphenyl)(3-(4-picolyloxy)phenyl)sulfonium benzenesulfonate; (4-tert-butoxycarbonylmethyloxyphenyl) bis(3-(4-picolyloxy)phenyl)sulfonium benzenesulfonate; tris(3-(2-picolyloxy)phenyl)sulfonium p-toluenesulfonate; bis(4-tert-butoxyphenyl)(3-(2-picolyloxy)phenyl)sulfonium p-toluenesulfonate; (4-tert-butoxyphenyl)bis(3-(2-picolyloxy)phenyl)sulfonium p-toluenesulfonate; bis(4-tert-butoxycarbonylmethyloxyphenyl)(3-(2-picolyloxy)-phenyl) sulfonium p-toluenesulfonate; (4-tert-butoxycarbonylmethyloxyphenyl)bis(3-(2-picolyloxy)-phenyl)sulfonium p-toluenesulfonate; bis(4-(1-ethoxyethyloxy)phenyl)(3-(2-picolyloxy)phenyl)-sulfonium p-toluenesulfonate; (4-(1-ethoxyethyloxy)phenyl)bis(3-(2-picolyloxy)phenyl)-sulfonium p-toluenesulfonate; bis(4-tetrahydropyranyloxyphenyl)(3-(2-picolyloxy)phenyl)-sulfonium p-toluenesulfonate; (4-tetrahydrofuranyloxyphenyl)bis(3-(2-picolyloxy) phenyl)-sulfonium p-toluenesulfonate; tris(3-(2-picolyloxy) phenyl)sulfonium p-ethylbenzene-sulfonate; tris(3-(2-picolyloxy)phenyl)sulfonium 2,4-dimethylbenzene-sulfonate; bis(4-tert-butoxyphenyl)(3-(2-picolyloxy)phenyl) sulfonium 2,4-dimethylbenzenesulfonate; (4-tert-butoxycarbonylmethyloxyphenyl)bis(3-(2-picolyloxy)-phenyl)sulfonium 2,4-dimethylbenzenesulfonate; (3-tert-butoxyphenyl)bis(3-(2-picolyloxy)phenyl)sulfonium p-tert-butylbenzenesulfonate; bis(4-tert-butoxycarbonylmethyloxyphenyl)(3-(2-picolyloxy)-phenyl) sulfonium 4-tert-butylbenzenesulfonate; (4-tert-butoxycarbonylmethyloxyphenyl)bis(3-(2-picolyloxy)-phenyl)sulfonium n-octylbenzenesulfonate; tris(3-(2-picolyloxy)phenyl)sulfonium benzenesulfonate; bis(4-tert-butoxyphenyl)(3-(2-picolyloxy)phenyl)sulfonium benzenesulfonate; (4-tert-butoxycarbonylmethyloxyphenyl) bis(3-(2-picolyloxy)-phenyl)sulfonium benzenesulfonate; tris(pyridin-3-yl)sulfonium p-toluenesulfonate; bis(4-tert-butoxyphenyl)(pyridin-3-yl)sulfonium p-toluenesulfonate; (4-tert-butoxyphenyl)bis(pyridin-3-yl)sulfonium p-toluenesulfonate; bis(4-tert-butoxycarbonylmethyloxyphenyl)(pyridin-3-yl)-sulfonium p-toluenesulfonate; (4-tert-butoxycarbonylmethyloxyphenyl)bis(pyridin-3-yl)-sulfonium p-toluenesulfonate; bis(4-(1-ethoxyethyloxy) phenyl)(pyridin-3-yl)sulfonium p-toluenesulfonate; (4-(1-ethoxyethyloxy)phenyl)bis(pyridin-3-yl)sulfonium p-toluenesulfonate; bis(4-tetrahydropyranyloxyphenyl) (pyridin-3-yl)sulfonium p-toluenesulfonate; (4-tetrahydrofuranyloxyphenyl)bis(pyridin-3-yl)sulfonium p-toluenesulfonate; tris(pyridin-3-yl)sulfonium p-ethylbenzenesulfonate; tris(pyridin-3-yl)sulfonium 2,4-dimethylbenzenesulfonate; bis(4-tert-butoxyphenyl) (pyridin-3-yl)sulfonium 2,4-dimethyl-benzenesulfonate; (4-tert-butoxycarbonylmethyloxyphenyl)bis(pyridin-3-yl)-sulfonium 2,4-dimethylbenzenesulfonate; (4-tert-butoxyphenyl)bis(pyridin-3-yl)sulfonium p-tert-butylbenzenesulfonate; (4-tert-butoxycarbonylmethyloxyphenyl)bis(pyridin-3-yl)-sulfonium n-octylbenzenesulfonate; tris(pyridin-3-yl) sulfonium benzenesulfonate; bis(4-tert-butoxyphenyl) (pyridin-3-yl)sulfonium benzenesulfonate; (4-tert-butoxycarbonylmethyloxyphenyl)bis(pyridin-3-yl)-sulfonium benzenesulfonate; tris(pyridin-2-yl)sulfonium p-toluenesulfonate; bis(4-tert-butoxyphenyl)(pyridin-2-yl) sulfonium p-toluenesulfonate; (4-tert-butoxyphenyl)bis (pyridin-2-yl)sulfonium p-toluenesulfonate; bis(4-tert-butoxycarbonylmethyloxyphenyl)(pyridin-2-yl)-sulfonium p-toluenesulfonate; (4-tert-butoxycarbonylmethyloxyphenyl)bis(pyridin-2-yl)-sulfonium p-toluenesulfonate; bis(4-(1-ethoxyethyloxy) phenyl)(pyridin-2-yl)sulfonium p-toluenesulfonate; (4-(1-ethoxyethyloxy)phenyl)bis(pyridin-2-yl)sulfonium p-toluenesulfonate; bis(4-tetrahydropyranyloxyphenyl) (pyridin-2-yl)sulfonium p-toluenesulfonate; (4-tetrahydrofuranyloxyphenyl)bis(pyridin-2-yl)sulfonium p-toluenesulfonate; tris(pyridin-2-yl)sulfonium p-ethylbenzenesulfonate; tris(pyridin-2-yl)sulfonium 2,4-dimethylbenzenesulfonate; bis(4-tert-butoxyphenyl) (pyridin-2-yl)sulfonium 2,4-dimethylbenzenesulfonate; (4-tert-butoxyphenyl)bis(pyridin-2-yl)sulfonium 2,4-dimethylbenzenesulfonate; bis(3-tert-butoxycarbonylmethyloxyphenyl)(pyridin-2-yl)-sulfonium 2,4-dimethylbenzenesulfonate; (4-tert-butoxycarbonylmethyloxyphenyl)bis(pyridin-2-yl)-sulfonium 2,4-dimethylbenzenesulfonate; (4-tert-butoxyphenyl)bis(pyridin-2-yl)sulfonium p-tert-butylbenzenesulfonate; (4-tert-butoxycarbonylmethyloxyphenyl)bis(pyridin-2-yl)-sulfonium n-octylbenzenesulfonate; and tris(pyridin-2-yl) sulfonium benzenesulfonate.

In still yet another embodiment, the photoacid generator includes alkylsulfonium salts. Examples of alkylsulfonium salts include cyclohexylmethyl(2-oxocyclohexyl) sulfonium trifluoromethanesulfonate; dicyclohexyl(2-oxocyclohexyl) sulfonium trifluoromethanesulfonate; cyclopentylmethyl(2-oxocyclohexyl)sulfonium trifluoromethanesulfonate; and cycloheptylmethyl(2-oxocyclopentyl)sulfonium trifluoromethanesulfonate.

Any suitable wavelength of radiation may be employed to expose the resist. For example, radiation having wavelengths from about 1 nm to about 500 nm may be employed, including X-rays and electron beams (e-beams). Resists may include a 157 nm sensitive resist, a 193 nm sensitive resist, an I-line, H-line, G-line, E-line, mid UV, deep UV, an extreme UV resist material, an X-ray sensitive resist, and an e-beam sensitive resist. Deep UV resists are preferred. Resists are commercially available from a number of sources, including Shipley Company, Kodak, Hoechst Celanese Corporation, Arch Chemical, Aquamer, Hunt, Clariant, JSR Microelectronics, and Brewer. A specific example of a deep UV photoresist is a combination of a partially t-butoxycarbonyloxy substituted poly-p-hydroxystyrene and a photoacid generator.

The resist may be deposited using any suitable means on the substrate. For example, the resist may be spin-coated on the substrate. The resist is applied to any suitable thickness as the thickness is not critical to the invention. In one embodiment, the resist is applied to a thickness from about 200 Å to about 30,000 Å. In another embodiment, the resist is applied to a thickness from about 1,000 Å to about 20,000 Å. In yet another embodiment, the resist is applied to a thickness from about 2,000 Å to about 15,000 Å.

A coating containing a coating material, a basic compound, a photoacid generator, and optionally a dye is deposited over the patterned resist. The coating material is typically a polymeric material suitable for forming removable coatings. A removable coating can be adsorbed, dissolved, and/or solubilized by a removing solution. Coating materials include water soluble polymers, base soluble polymers, acid soluble polymers, and organic soluble polymers. Thus, removing solutions include suitable aqueous solutions, base solutions including aqueous base solutions, acid solutions including aqueous acid solutions, and organic solvents. However, the removing solutions do not substantially degrade the underlying patterned resist.

The basic compound is mobile within the coating in that it can migrate to the interface between the coating and the patterned resist and diffuse into the patterned resist. Subsequently, the basic compound inhibits the acid catalyzation of the outer portions of the patterned acid catalyzed resist.

Basic compounds have a pH above 7. Bases generally include organic bases and inorganic bases. Bases more specifically include alkali metal, alkaline earth metal and ammonium hydroxides, silicates, phosphates, borates, carbonates, and mixtures thereof, and amines and mixtures thereof. For example, the base may include one or more alkali metal hydroxides, alkaline earth metal hydroxides, ammonium hydroxides, alkali metal silicates and so on.

Alkali metals include lithium, sodium, potassium, rubidium and cesium. Alkaline earth metals include beryllium, magnesium, calcium, strontium, and barium. Ammonium ions include quaternary ammonium ions represented by Formula (II):

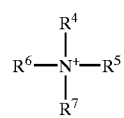

(II)

where $R^4$ to $R^7$ are individually selected from hydrogen and alkyl groups containing 1 to about 5 carbon atoms, and hydroxyalkyl containing 1 to about 5 carbon atoms. In a preferred embodiment, $R^4$ to $R^7$ are each hydrogen, methyl or ethyl.

Specific examples of bases include sodium tetraborate, sodium carbonate, sodium bicarbonate, sodium hydroxide, sodium phosphate, sodium pyrophosphate and other polyphosphates, sodium silicate, potassium carbonate, potassium bicarbonate, potassium hydroxide, potassium phosphate, potassium pyrophosphate and other polyphosphates, ammonium carbonate, ammonium hydroxide, ammonium hydrogen phosphate, ammonium phosphate, calcium carbonate, calcium hydroxide, calcium phosphate, calcium pyrophosphate, calcium silicate, magnesium carbonate, magnesium hydroxide, magnesium phosphate, magnesium pyrophosphate, magnesium silicate, tetramethylammonium carbonate, tetramethylammonium hydroxide, tetramethylammonium hydrogen phosphate, tetramethylammonium phosphate, tetramethylammonium carbonate, tetraethylammonium hydroxide, tetraethylammonium hydrogen phosphate, tetraethylammonium phosphate, or mixtures of two or more thereof.

Amines include aliphatic amines, cycloaliphatic amines, aromatic amines and heterocyclic amines. The amine may be a primary, secondary or tertiary amine. The amine may be a monoamine, diamine or polyamine. In another embodiment, the amine is a hydroxyamine. Examples of hydroxyamines include hydroxyamines having one or more hydroxyalkyl groups each having 1 to about 8 carbon atoms, and preferably 1 to about 5 carbon atoms such as hydroxymethyl, hydroxyethyl and hydroxybutyl groups. Specific examples of hydroxyamines include mono-, di- and tri-ethanolamine, 3-amino-1-propanol, 2-amino-2-methyl-1-propanol, 2-amino-2-ethyl-1,3-propanediol, tris(hydroxymethyl) aminomethane, N-methylethanolamine, 2-diethylamino-2-methyl-1-propanol and triethanolamine.

The acid generated by the photoacid generator in the coating cleaves acid labile groups that are attached to the resist polymer backbone in the inner regions of the patterned resist. As stated above, photoacid generators produce acids due to light or heat activation. The photoacid generators mentioned above in connection with the resist materials may also be employed in the coating. They are not listed again here for the sake of brevity. The coating may contain the same or different photoacid generators as the acid catalyzed resist.

The optional dye in the coating contributes to the ability of the coating to resist penetration of the radiation so that the radiation induces acid generation by the photoacid generator in the upper portions of the coating but the lower portions. Accordingly, the dye is preferably a light absorbing dye. The dye specifically absorbs the wavelength of light employed during the blanket irradiation, described below. Light absorbing dyes are known. Examples of light absorbing dyes include substituted benzotriazoles, such as 2(2'-hydroxyphenyl)benzotriazole, aminoallylidennemalononitriles, benzylidene acid esters, phenylazobenzene derivatives, styryl compounds, dicyano compounds, diazotype materials, pyrylium salts, thiapyrylium salts, benzothiazole compounds, and the like.

Coating materials typically contain water soluble polymers. Water soluble polymers according to the invention are those which can form films. Water soluble polymers include poly(acrylic acid), poly(methacrylic acid), poly(vinyl alcohol), poly(vinyl acetal), mixtures of poly(vinyl acetal) and methoxy-methylol-urea, mixtures of poly(vinyl acetal) and methoxy-methylol-melamine, mixtures of poly(vinyl acetal), methoxy-methylol-melamine and polyallyl-amine, cellulose derivatives including hydroxypropyl cellulose, hydroxyethyl cellulose, hydroxyalkyl alkali metal carboxylalkyl cellulose derivatives, and free acid hydroxyalkyl carboxyalkyl cellulose derivatives, natural polysaccharide gums and their derivatives, polyethylene glycol, water soluble polyesters, polyvinyl pyrrolidone, polycarboxylic acid derivatives, vinyl methyl ether homopolymers and copolymers, casein, gelatin, solubilized proteins, polyacrylamide, polyamines, polyquaternary amines, styrene maleic anhydride (SMA) resins, and polyethylene amine. Water soluble polymers further include carbohydrates such as starch derived from different plant sources, including high amylose and high amylopectin varieties. By "starch," as referred to herein, is also meant water soluble film forming polymeric materials derived from starch including starch derivatives such as starch hydrolyzate products, modified starches, modified starch derivatives and maltodextrins.

The coating is deposited over the patterned resist in a manner that it covers or at least substantially covers the structural features of the patterned resist. For example, if the patterned resist is comprised by a plurality of lines, then the acid containing coating fills the trenches formed by the lines of the patterned resist and substantially covers the lines of the patterned resist.

The coating contains a suitable amount of basic compound to diffuse into the patterned resist and suitable amount of an acid generator to form enough acid to form a deprotected region within features of the patterned resist. In one embodiment, the coating contains from about 0.001% to about 10% by weight of at least one basic compound and from about 0.001% to about 10% by weight of at least one photoacid generator. In another embodiment, the coating contains from about 0.01% to about 5% by weight of at least one basic compound and from about 0.01% to about 5% by weight of at least one photoacid generator. In yet another embodiment, the coating contains from about 0.05% to about 2% by weight of at least one basic compound and from about 0.05% to about 2% by weight of at least one photoacid generator. The coating may optionally further contain various additives such as coating forming additives, surfactants, mobility enhances, etc.

The time which the coating is permitted to contact the resist depends primarily upon the identity of the basic compound, the concentration of the basic compound in the coating, the identity of the photoacid generator, the concentration of the photoacid generator in the coating, the identity of the resist, and the desired size of the deprotected region in the patterned resist. In one embodiment, the coating is permitted to contact the resist for a time period from about 1 second to about 3 hours, although slightly shorter or longer times may be permitted. In another embodiment, the coating is permitted to contact the resist for a time period from about 10 seconds to about 30 minutes. In yet another embodiment, the coating is permitted to contact the resist for a time period from about 15 seconds to about 5 minutes. Generally, a longer contact time leads to a thicker resulting deprotected region within the resist.

The coating coated patterned resist is subjected to blanket irradiation to induce formation of acid by the photoacid generator. Examples of irradiation include 157 nm light, 193 nm light, I-line light (365 nm), H-line light, G-line light, E-line light, mid UV light, deep UV light (248 nm), extreme UV light including 11 nm and 13 nm, X-ray light, and e-beams.

Optionally, heat is applied when the coating containing is contacted with the resist, before and/or after irradiation. In some instances, heat promotes diffusion of the basic compound and/or the formation of the deprotection region. In one embodiment, the coating is contacted with the resist at a temperature from about 20° C. to about 200° C. In another embodiment, the coating is contacted with the resist at a temperature from about 40° C. to about 150° C. In yet another embodiment, the coating is contacted with the resist at a temperature from about 50° C. to about 110° C.

The coating is removed from the substrate using any suitable means, such as using a removing solution. Generally, the coating is removed from the substrate using an aqueous, basic, or organic solution. It is noted that in some embodiments, the removing solution may also remove the deprotected region within the resist. This is permissible so long as the un-deprotected regions of the patterned resist are not deformed or degraded by the removing solution. The aqueous, basic, or organic solution adsorbs, dissolves, and/or solubilizes the coating. In an optional embodiment, the substrate is rinsed after the coating is removed. In some instances, rinsing with water serves to quench or inhibit further chemical change induced by the basic compound and/or acid upon the patterned resist. Removing solutions include water, deionized water, hydroxide solutions such as sodium hydroxide solutions, potassium hydroxide solutions, quaternary ammonium hydroxide solutions, and organic solvents, all of which may optionally contain at least one surfactant.

The deprotected region of the patterned resist is then removed from the patterned resist (it is noted that the deprotected region may be removed from the patterned resist during removal of the coating from the structure). The deprotected region is removed in a manner so that the remaining patterned resist is not deformed or degraded. In this connection, the un-deprotected regions of the patterned resist act as an etch stop layer when removing the deprotected region. Dry or wet etching techniques may be employed, although wet etch techniques are preferred. In a preferred embodiment, a developer, commonly used to pattern an irradiated resist, is used to remove the deprotected region from the patterned resist. For example, hydroxide developers including sodium hydroxide solutions, potassium hydroxide solutions, quaternary (alkyl) ammonium hydroxide solutions, all of which may or may not contain at least one surfactant, may be employed.

In an optional embodiment, prior to removing the deprotected region of the patterned resist, a brief plasma etch may be conducted to facilitate complete and full removal of the deprotected region. In another optional embodiment, after removing the deprotected region of the patterned resist, a brief plasma etch may be conducted to ensure complete and full removal of the deprotected region in the event that a full penetration depth is not attained by the acid.

Remaining on the substrate are two or more structures (depending upon the shape of the patterning of the resist) of a patterned resist in which the number of features or structures are doubled compared to immediately after development (before application of the coating). In one embodiment, the patterned resist treated in accordance with the present invention contains sub-lithographic structures or features. Sub-lithographic structures have dimensions that are smaller than those obtainable without the methods of the present invention. For example, sub-lithographic structures, such as a line, have a dimension such as a width from about 500 Å to about 2,000 Å, and in other instances from about 600 Å to about 1,500 Å. In another embodiment, the patterned resist treated in accordance with the present invention contains structures or features that have reduced sizes to a desired extent, but are not necessarily sub-lithographic.

The dimensions of the resulting features or structures depend primarily upon the specific identity and amount of the basic compound and the photoacid generator, the length of time the coating is in contact with the patterned resist, and the identity of the resist material. The dimensions such as the width of the resulting features or structures are decreased corresponding to the size of the deprotected regions of the resist and the original size of the untreated structures.

In one embodiment, the resulting features or structures of a patterned resist treated in accordance with the present invention have a size that is about 80% or less, about 75% or less, about 60% or less, and even about 50% or less than the size of the originally formed features or structures of the patterned resist.

In one embodiment, the resultant spacing between two resultant features or structures formed from one original feature or structure is about 1,000 Å or less. In another embodiment, the resultant spacing between two resultant features or structures formed from one original feature or structure is about 500 Å or less. In yet another embodiment, the resultant spacing between two resultant features or structures formed from one original feature or structure is about 250 Å or less.

The resulting resist pattern made in accordance with the present invention may be useful for subsequent processing of the substrate on which it is positioned. For example, the resist pattern made in accordance with the present invention may be used for forming narrow features using one of photolithography techniques (pattern transfer to underlying layer), etching techniques, or deposition techniques. In particular, the resist pattern made in accordance with the present invention may be used as a mask during photolithography techniques, etching techniques, or deposition techniques. In one embodiment, the resist pattern made in accordance with the present invention consists of a plurality of lines that are narrower than the originally patterned resist, the resist pattern is used as a mask during etching thereby forming lines under the patterned resist. In this embodiment, the lines formed under the patterned resist made in accordance with the present invention are narrower than lines that could have been formed under the originally patterned resist. In another embodiment, the resist pattern made in accordance with the present invention contains a plurality of openings for forming contact holes that are larger than the originally patterned resist, and the resist pattern is used as a mask during etching thereby forming contact holes adjacent the patterned resist. In this embodiment, the contact holes formed adjacent the patterned resist made in accordance with the present invention are larger than contact holes that could have been formed under the originally patterned resist.

One specific embodiment of the methods of the present invention is now described in connection with Figures. Referring to FIG. 1, a substrate 10 is provided with a patterned acid catalyzed resist 12 over a portion of the substrate 10. Although not shown, substrate 10 may include any suitable semiconductor material (one or more layers of semiconductor materials), for example, a monocrystalline silicon substrate. Also, although not shown, substrate 10 may include of one or more layers including substrate layers, diffusion regions, dielectric layers such as oxides, devices, polysilicon layers, and the like. A coating 14 is deposited over the substrate covering the patterned resist 12. The patterned resist 12 is a line having a width of about 2,500 Å. The coating 14 contains a water soluble polymer, a basic compound, a photoacid generator and a light absorbing dye.

Figure 2:
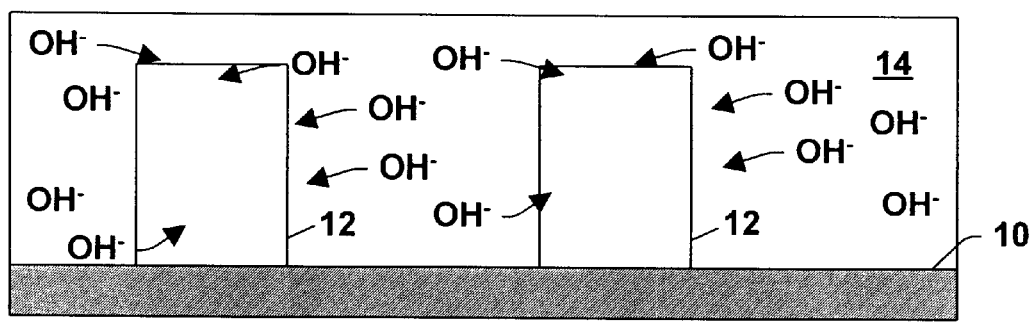
FIG. 2 illustrates a cross-sectional view of one aspect of a method according to the present invention.

Referring to FIG. 2, mobile hydroxide ions in the coating 14 near the patterned resist 12 diffuse into the patterned resist 12. Although not wishing to be bound by any theory, it is believed that hydroxide ions subsequently prevent an acid from catalyzing the patterned resist. The substrate 10 is optionally baked, such as heated up to about 200° C. for about 1 minute, to facilitate diffusion of the basic compound into the outer portions of the patterned resist 12.

Figure 3:
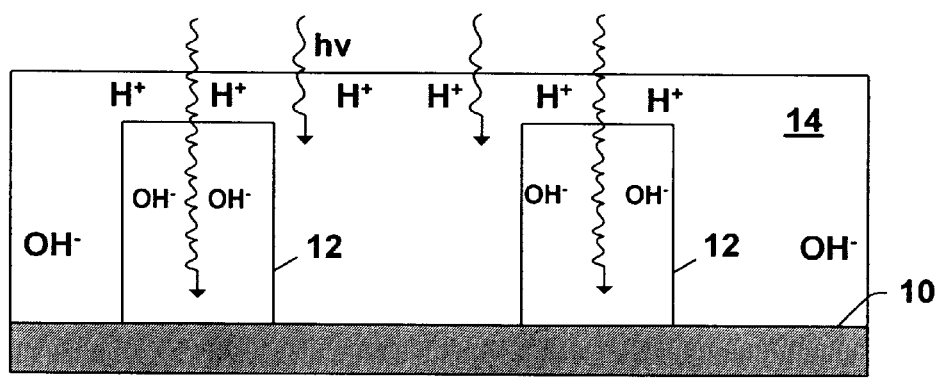
FIG. 3 illustrates a cross-sectional view of one aspect of a method according to the present invention.

Referring to FIG. 3. the substrate 10 is subjected to a flood exposure of UV light (shown by the squiggly arrows). Due, in part, to the presence of a dye in the coating 14, the UV light does not deeply penetrate the coating. However, the light does penetrate the patterned resist 12. The UV light induces the photoacid generator in the coating 14 to produce an acid, shown by the $H^+$ ions. The $H^+$ ions are generated in the upper or top portions of the coating 14, since the UV light penetrates the coating shallowly. Due to the diffusion shown in FIG. 2, hydroxide ions are shown near the edges (outer portions) of the patterned resist 12.

Figure 4:
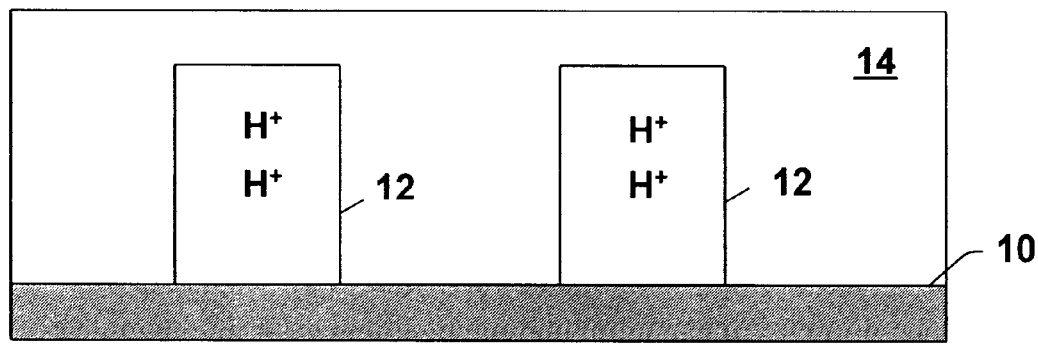
FIG. 4 illustrates a cross-sectional view of one aspect of a method according to the present invention.

Referring to FIG. 4, the substrate is subjected to another or a first soft bake to facilitate the formation of acid by the photoacid generator in the patterned resist 12 due, in part, to the penetration of the UV light through the patterned resist 12. For example, the substrate may be heated to a temperature of about 175° C. for 2 minutes. The presence of the hydroxide ions in the coating 14 leads to the partial or complete neutralization of the of the $H^+$ ions in the upper portions of the coating 14. The presence of the hydroxide ions in the outer portions of the patterned resist 12 leads to the partial or complete neutralization of the of the $H^+$ ions in the outer portions of the patterned resist 12. Left un-neutralized are the $H^+$ ions in the inner portions of the patterned resist 12.

Figure 5:
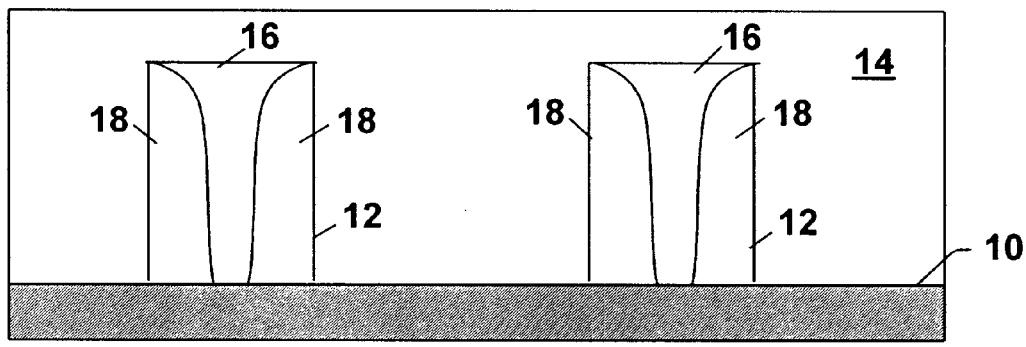
FIG. 5 illustrates a cross-sectional view of one aspect of a method according to the present invention.

Referring to FIG. 5, the acid generated by the photoacid generator in the patterned resist 12 catalyzes the inner portions of the patterned resist 12 forming a deprotected region therein 16. The outer portions of the patterned resist 12 are not chemically influenced by the acid for two primary reasons; namely, that the basic compound is diffused within the outer portions and acid is not generated in the coating 14 at lower or deeper depths near the substrate 10 surface. The patterned resist 12 thus has two regions, the inner deprotected region 16 and the outer un-deprotected regions 18.

Figure 6:
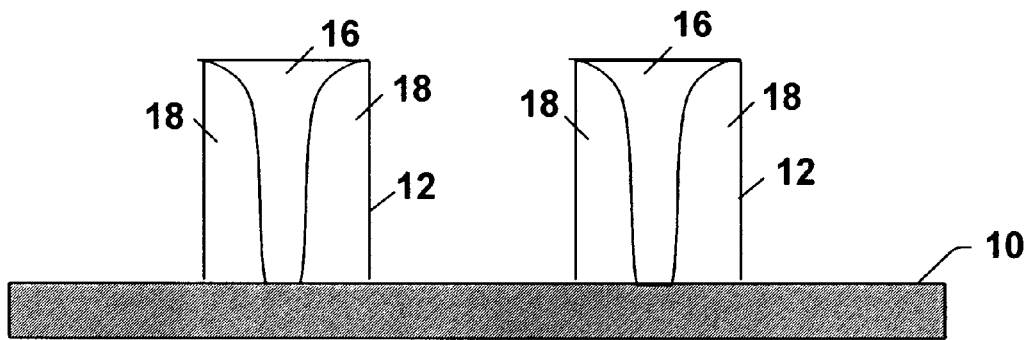
FIG. 6 illustrates a cross-sectional view of one aspect of a method according to the present invention.

Referring to FIG. 6, the coating 14 is removed by any suitable means. For example, a water rinse, optionally containing a surfactant, is used to remove the coating 14 from substrate 10 leaving the patterned resist 12.

Figure 7:
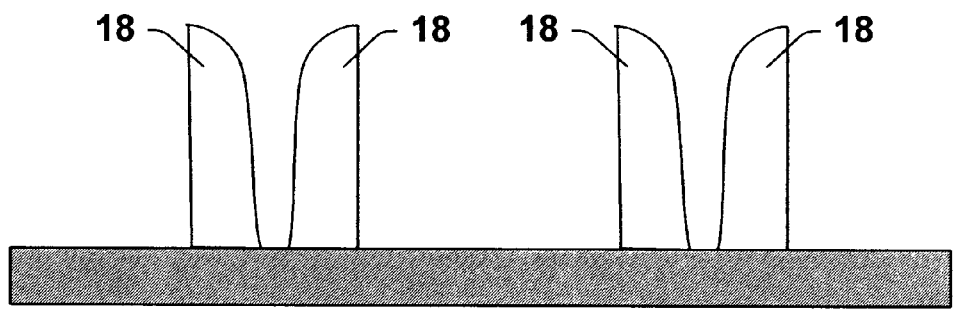
FIG. 7 illustrates a cross-sectional view of the results of one aspect of a method according to the present invention.

Referring to FIG. 7, the deprotected region 16 of the patterned resist 12 is removed by any suitable means. For example, the structure is contacted with a suitable developer, such an aqueous tetramethylammonium hydroxide solution, to remove the deprotected region 16 from substrate 10 leaving the outer un-deprotected regions 18 as features on the substrate 10. The outer un-deprotected regions 18 are not degraded or damaged by the removal of the deprotected region 16. In this embodiment, the thickness of each of the un-deprotected regions 18 is about 800 Å. The thickness of the area vacated by the deprotected region 16 is about 900 Å.

Generally speaking, when the patterned resist 12 is in the form of a line, it is possible to make two lines having a decreased spacing of about 1,800 Å or less. In another embodiment, the methods of the present invention provide lines having a decreased spacing of about 1,500 Å or less. In yet another embodiment, the methods of the present invention provide lines having a decreased spacing of about 1,000 Å or less. In still yet another embodiment, the methods of the present invention provide lines having a decreased spacing of about 800 Å or less.

Also when the patterned resist 12 is in the form of a line, it is possible to make two lines having a width of about 1,800 Å or less. In another embodiment, the methods of the present invention provide lines having width of about 1,500 Å or less. In yet another embodiment, the methods of the present invention provide lines having widths of about 1,000 Å or less. In still yet another embodiment, the methods of the present invention provide lines having widths of about 800 Å or less.

Figure 8:
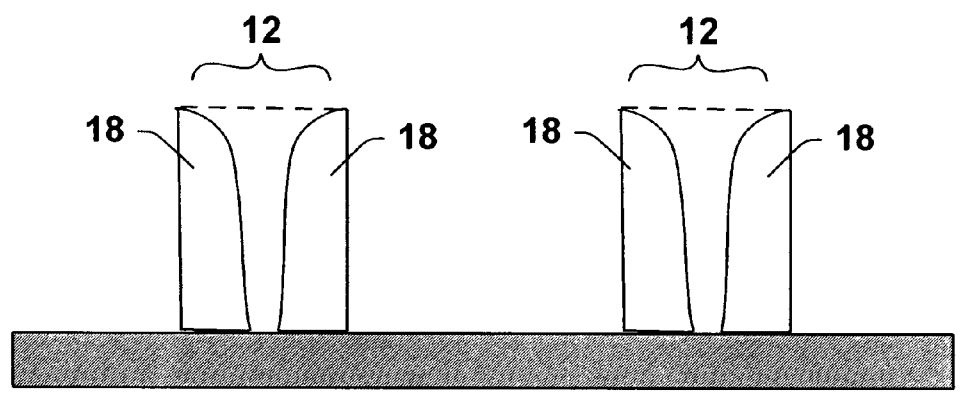
FIG. 8 illustrates a cross-sectional view of the results of one aspect of a method according to the present invention.

Referring to FIG. 8, the original size of the patterned resist 12 is shown again over substrate 10 using dashed lines, which indicate the space assumed by original patterned resist 12. The un-deprotected regions 18 may be used in further semiconductor processing, such as for transferring a pattern to an underlying layer in substrate 10 (acting as etch mask pattern). The un-deprotected regions 18 are particularly useful for forming narrow features using one of photolithography techniques, etching techniques, or deposition techniques.

Although shown as asymmetric mirror images, un-deprotected regions 18 may be substantially symmetric in shape, or post-treated (etch, CMP) to appear symmetrical. In this connection, un-deprotected regions 18 may be substantially rectangular in shape.

In one embodiment, although not shown, the original patterned resist 12 features are spaced so that the resultant un-deprotected regions 18 formed are equally spaced from each other. In this embodiment, the treatment has the effect of decreasing the pitch of the initially patterned structure. In particular, in this embodiment, the pitch is halved.

One advantageous aspect of the chemical structure doubling process of the present invention is the ability to decrease the size of structural resist features made using lithographic techniques with non-lithographic techniques. This size reduction technique can be employed to reduce the size of patterned resist features and spacings therebetween below the limits of lithography. This size reduction technique can be employed to reduce the spacing between features with non-lithographic techniques.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of treating a patterned resist comprising:
providing the patterned resist having a first number of structural features, the patterned resist comprising an acid catalyzed polymer;
contacting a coating containing a coating material, at least one basic compound, a photoacid generator, and a dye with the patterned resist;
irradiating the coated patterned resist;
permitting a deprotection region to form within an inner portion of the patterned resist; and
removing the coating and the deprotection region to provide a second number of patterned resist structural features, wherein the first number is smaller than the second number.

2. The method of claim 1, wherein the acid catalyzed polymer is a chemically amplified photoresist.

3. The method of claim 1, wherein the acid catalyzed polymer comprises an acid labile group.

4. The method of claim 1, wherein the basic compound comprises at least one selected from the group consisting of alkali metal hydroxides, alkali metal silicates, alkali metal phosphates, alkali metal borates, alkali metal carbonates, alkaline earth metal hydroxides, alkaline earth metal silicates, alkaline earth metal phosphates, alkaline earth metal borates, alkaline earth metal carbonates, ammonium hydroxides, ammonium silicates, ammonium phosphates, ammonium borates, ammonium carbonates, and amines.

5. The method of claim 1, wherein the coating material comprises at least one of a water soluble polymer and a base soluble polymer.

6. The method of claim 1, wherein the second number is about twice the first number.

7. The method of claim 1, wherein the coating comprises from about 0.001% to about 10% by weight of the basic compound and from about 0.001% to about 10% by weight of the photoacid generator.

8. A method of decreasing the spacing between patterned resist features comprising:
depositing a coating over the patterned resist features having a first spacing therebetween, the coating comprising at least a basic compound, a photoacid generator, a light absorbing dye, and a coating material, the patterned resist feature comprising a polymer having an acid labile pendent group;
irradiating the coated patterned resist features, thereby forming a deprotected region in the inner portions of the patterned resist features;
optionally heating the coated patterned resist features; and
removing the coating and the deprotected region thereby providing patterned resist features having a second spacing therebetween, wherein the second spacing is smaller than the first spacing.

9. The method of claim 8, wherein the patterned resist feature comprises a mid ultraviolet photoresist, a deep ultraviolet photoresist, a 193 nm sensitive photoresist, a 157 nm sensitive photoresist, or an extreme ultraviolet photoresist.

10. The method of claim 8, wherein the coating contains from about 0.01% to about 5% by weight of the basic compound and from about 0.01% to about 5% by weight of the photoacid generator.

11. The method of claim 8, wherein the light absorbing dye comprises at least one of a substituted benzotriazole, an aminoallylidennemalononitrile, a benzylidene acid ester, a phenylazobenzene derivative, a styryl compound, a dicyano compound, a diazotype material, a pyrylium salt, a thiapyrylium salt, and a benzothiazole compound.

12. The method of claim 8, wherein the coating material comprises at least one of poly(acrylic acid), poly(methacrylic acid), poly(vinyl alcohol), cellulose derivatives, natural polysaccharide gums and their derivatives, polyethylene glycol, water soluble polyesters, polyvinyl pyrrolidone, polycarboxylic acid derivatives, vinyl methyl ether homopolymers and copolymers, casein, gelatin, solubilized proteins, polyacrylamide, polyamines, polyquaternary amines, styrene maleic anhydride resins, polyethylene amine, novolac polymers, and poly(p-hydroxystyrene).

13. The method of claim 8, wherein the acid labile pendant group comprises at least one of a t-butoxycarbonyl group, an ether group, an acetal group, and a ketal group.

14. The method of claim 8, wherein the coated patterned resist feature is heated to a temperature from about 40° C. to about 200° C. for a time period from about 10 seconds to about 30 minutes prior to removing the coating and the deprotected region.

15. A method of making a sub-lithographic structure, comprising:

patterning a chemically amplified resist so as to have lithographic structures;

contacting coating with the patterned chemically amplified resist, the coating comprising an amine or a hydroxide compound, a photoacid generator, a light absorbing dye, and a coating material;

irradiating the coated patterned chemically amplified resist with light having a wavelength of at least one of 365 nm, 248 nm, 193 nm, and 157 nm;

removing the coating from the patterned chemically amplified resist; and contacting the patterned chemically amplified resist with an aqueous alkaline developer to provide the sub-lithographic structure.

16. The method of claim 15, wherein the chemically amplified resist comprises a polymer having acid sensitive side chain groups which are bonded to the polymer backbone and are reactive with an acidic proton.

17. The method of claim 15, wherein the coating material comprises at least one of poly(acrylic acid), poly(methacrylic acid), poly(vinyl alcohol), cellulose derivative, natural polysaccharide gum and their derivatives, polyethylene glycol, water soluble polyester, polyvinyl pyrrolidone, polycarboxylic acid derivative, vinyl methyl ether homopolymer and copolymer, casein, gelatin, solubilized protein, polyacrylamide, polyamine, polyquaternary amine, styrene maleic anhydride resin, polyethylene amine, novolac polymer, and poly(p-hydroxystyrene).

18. The method of claim 15, wherein the sub-lithographic structure is a line having a width of about 1,000 Å or less.

19. The method of claim 15, wherein the coated patterned chemically amplified resist is heated to a temperature from about 40° C. to about 150° C. for a time period from about 15 seconds to about 10 minutes at least of prior to irradiating the coated patterned chemically amplified resist and prior to removing the coating.

20. The method of claim 15, wherein the sub-lithographic structure is a line having a width about 800 Å or less.

* * * * *